United States Patent

Wakley et al.

[15] 3,697,666

[45] Oct. 10, 1972

[54] ENCLOSURE FOR INCAPSULATING ELECTRONIC COMPONENTS

[72] Inventors: Wilbur T. Wakley; Michael T. Leeds, both of San Diego, Calif.

[73] Assignee: Diacon, Inc., San Diego, Calif.

[22] Filed: Sept. 24, 1971

[21] Appl. No.: 183,470

[52] U.S. Cl. ................174/52 S, 29/588, 174/50.64, 317/234 F, 317/234 G

[51] Int. Cl. ................H05k 5/00

[58] Field of Search..174/DIG. 3, 52 S, 50.64, 50.63, 174/50.61, 50.6; 317/234 F, 234 G, 234 H; 29/627, 588, 589, 590

[56] References Cited

UNITED STATES PATENTS

| | | | |
|---|---|---|---|
| 3,072,832 | 1/1963 | Kilby | 174/DIG. 3 |
| 3,325,586 | 6/1967 | Suddick | 174/DIG. 3 |
| 3,335,336 | 8/1967 | Urushida et al. | 174/DIG. 3 |

*Primary Examiner*—Darrell L. Clay
*Attorney*—Roger S. Borovoy

[57] ABSTRACT

An enclosure for encapsulating an electronic component including a substrate and a conductive lead frame attached to the substrate and embedded in a composite glass layer, the layer having two portions. The lower portion is a substantially devitrified glass and the upper portion is a substantially non-devitrified glass. The lead frame has surfaces exposed for electrical contact both within and without the perimeter of the substrate, the intermediate part of the lead frame between the exposed portions being embedded in the composite glass layer.

4 Claims, 6 Drawing Figures

INVENTORS
WILBUR I. WAKELY
MICHAEL T. LEEDS
BY [signature]
ATTORNEY

ENCLOSURE FOR INCAPSULATING ELECTRONIC COMPONENTS

BACKGROUND OF THE INVENTION

1. Field of the Invention

This invention relates generally to the field of packages for electronic devices, particularly to protective, hermetic enclosures for semiconductor devices.

2. Prior Art

The prior art enclosures, exemplified by U.S. Pat. No. 3,340,347, employ a combination of a ceramic substrate, a metal lead frame, and a non-devitrified glass composition which forms a glass-to-metal seal. Conventionally, the components of such a package are placed in the proper orientation for assembly while the glass remains substantially non-devitrified. The entire assembly is then placed into a furnace and the glass is melted and then devitrified, forming a firm, solid, hermetic glass-to-metal seal.

The disadvantage of the system of the prior art is that during the sealing process, it is fairly common for the metal lead frame to shift slightly within the molten glass. Such a shift can result in the breaking of the tiny metal wires connecting the device to the metal lead frame, ruining the device.

Accordingly, it would be advantageous to have an enclosure for a semiconductor device which prevented that movement and thus virtually assured the stability of the relative positions of the substrate and the lead frame during assembly and sealing.

SUMMARY OF THE INVENTION

Briefly, the enclosure for encapsulating electronic components of this invention comprises a substrate, such as a ceramic substrate of the same type used in the prior art. The conventional conductive lead frame is firmly attached to the substrate, being embedded in the composite glass layer of the invention upon the substrate. The composite layer has a first lower portion which is substantially devitrified, and a second upper portion which is substantially non-devitrified. The lead frame has surfaces exposed for electrical contact both within and without the perimeter of the substrate, the intermediate part of the lead frame between the exposed portions being embedded in the composite glass layer. The enclosure also requires a cap which is finally sealed to the substrate.

Since the enclosure of the invention has the lead frame embedded in a glass layer, at least a portion of which is devitrified prior to the final sealing process of the cap to the base, the prior art problem of motion of the lead frame during the final cap sealing step is totally eliminated. The details of the enclosure of the invention, as well as its method of its fabrication and assembly will be more clearly understood from the detailed description which follows.

DETAILED DESCRIPTION

Figure 1:
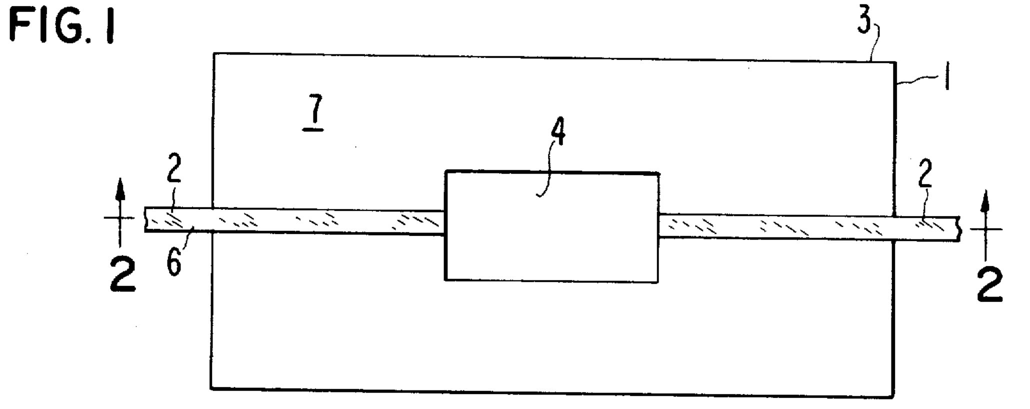
FIG. 1 shows a pictorial view of the substrate portion of the enclosure of the invention after the application of the first lower portion of the composite glass layer, but before the application of the second upper portion.

As shown in FIG. 1, the enclosure of the invention includes a substrate 1. Conventionally, such a substrate is ceramic. However, metal materials or other conductive materials could be used since the glass layers of the invention provide the necessary insulating layer between the substrate and the conductive lead frame 2. Although lead frame 2 is represented for illustration purposes as two leads, conventionally, more than two leads are employed, extending from outside the perimeter 3 of substrate 1 to the interior and oriented around the entire perimeter. The portions 5 of leads 2 adjacent to the interior of cavity 4 of substrate 1, and the portions 6 of leads 2 extending outside the perimeter 3 of substrate 1 are all free of glass and thus exposed for the purpose of making electrical contact. This is normally accomplished by soldering or welding wires.

The fabrication of the enclosure of the invention begins by the assembly of lead frame 2 onto substrate 1. During assembly, the leads 2 are normally connected to each other in a frame. First, a slurry of a devitrifiable glass material 7 is deposited upon substrate 1 over the entire substrate except the interior cavity 4 which is to remain free of glass. In some embodiments of the invention, it is possible to have glass layer 7 over cavity 4. However, it is more desirable to have this interior free of glass to enable direct thermal contact and heat conduction between the semi-conductor device which is to be enclosed in the package and the ceramic material of substrate 1 itself.

A devitrifiable glass is a type of glass which is capable of being devitrified. Devitrification is the growth of crystalline material in the glass. In normal glass-making procedures, steps are taken to prevent devitrification. However, in connection with the encapsulation of semi-conductor devices, a seal is made by employing a deliberate devitrification step. The sealing glass is initially applied at a relatively low temperature, and subsequently converted by devitrification at a higher temperature to a material of crystalline character that will withstand subsequent high temperature environments without softening or flowing.

The composition of the glass material can be one of many glasses capable of devitrification. Representative compositions are described in U.S. Pat. No. 3,248,350. These devitrifiable glass compositions are devitrified at temperatures normally in excess of about 400° C, as described in that patent.

In accordance with the invention, lead frame 2, as shown in FIG. 1, is then placed onto the glass layer 7. The assembly, including substrate 1, glass layer 7, and frame 2, with the frame resting in the glass, is placed into a conventional devitrification furnace. Devitrification can be carried out at temperatures ranging from 450° to 550° C at times between 2 minutes and 1 hour.

Using, for example, a glass composition called "CV–98" sold by Owens-Illinois, devitrification takes place satisfactorily at 500° C in about five minutes.

Figure 2:
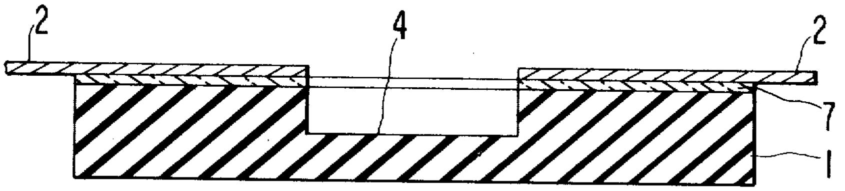
FIG. 2 is a cross-sectional view at 2—2 of the substrate shown in FIG. 1.
Figure 3:
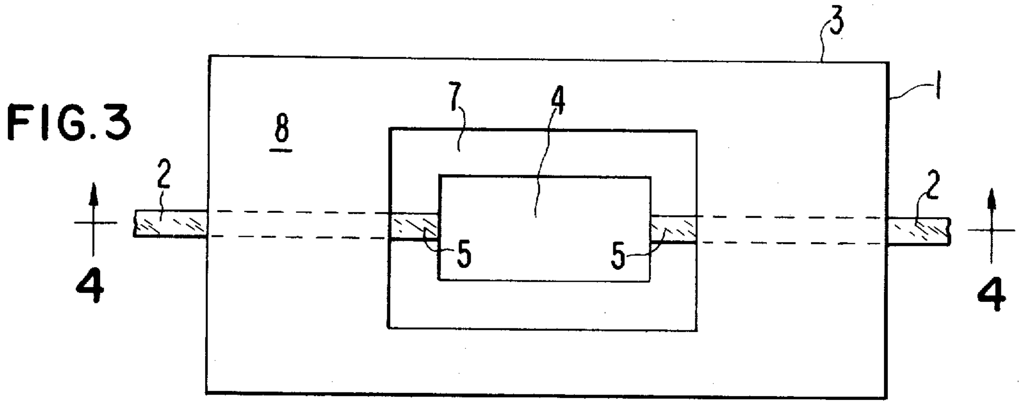
FIG. 3 is a pictorial view showing the substrate portion of the enclosure of the invention after the application of both portions of the composite glass layer.
Figure 4:
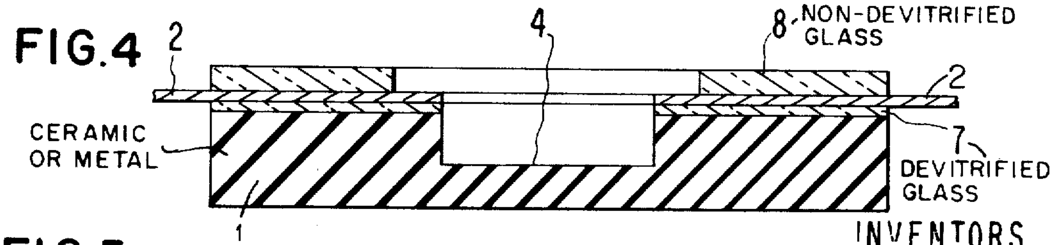
FIG. 4 is a cross-sectional view at 3—3 of the substrate shown in FIG. 3.

After substrate 1 has been removed from the devitrification oven and cooled, the second glass layer 8, shown in FIG. 2, is applied. The second layer is also a devitrifiable glass material, and must have thermal expansion characteristics compatible with the substrate, the previous glass layer, and the metal lead frame 2. However, it is not necessary that it be identical to the glass composition as used for the first layer as long as the above criteria are met. The second layer 8 is laid down on top of the devitrified first layer, covering the lead frame 2 except for the portions adjacent to and lying over cavity 4 to enable the semiconductor device to be attached directly to bare ceramic material of the enclosure 1, as discussed above. The portion 6 of leads 2 external to perimeter 3 of substrate 1 and the portions 5 of leads 2 adjacent to cavity 4 of substrate 1 remain free of glass so that wires or other electrical contacting means can be bonded directly to the metal leads 2. The second glass layer 8 is deposited at temperatures and times which will not permit devitrification. The layer is, however, perferably sintered at temperatures ranging from about 425° to 480° C, these temperatures being selected to be below the devitrification conditions (time and temperature) of the glass composition employed. The purpose of the sintering step is merely to solidify the glass layer, but to leave it non-devitrified so that it can later be devitrified during final sealing of the cap to the substrate.

Figure 5:
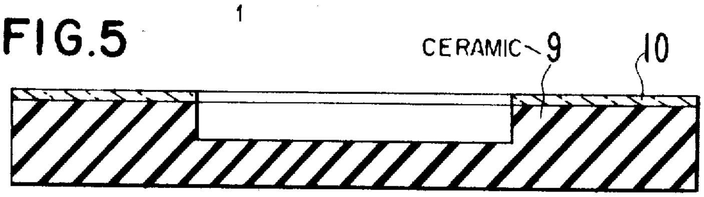
FIG. 5 is a cap for the enclosure of the invention.

Finally, a cap such as cap 9 shown in FIG. 5 is applied over the enclosure after the semiconductor device has been properly attached and wired within cavity 4 of substrate 1 shown in FIG. 2. Cap 9 as shown in FIG. 5, if desired, also have a non-devitrified glass layer 10. However, such a glass layer is not necessarily required because a seal can be made directly between glass layer 8 (FIG. 2) and the uncoated ceramic cap 9.

The advantage of the enclosure of the invention is that the lead frame 2 cannot move during final sealing. It is prevented from such motion by the lower devitrified glass layer 7. Yet there is an additional, non-devitrified glass layer 8 above the frame 2 to provide easy sealing of the cap 9 to the substrate. It is within the discretion of the user whether or not to employ a glass layer 10 on cap 9 for easier sealing.

Figure 6:
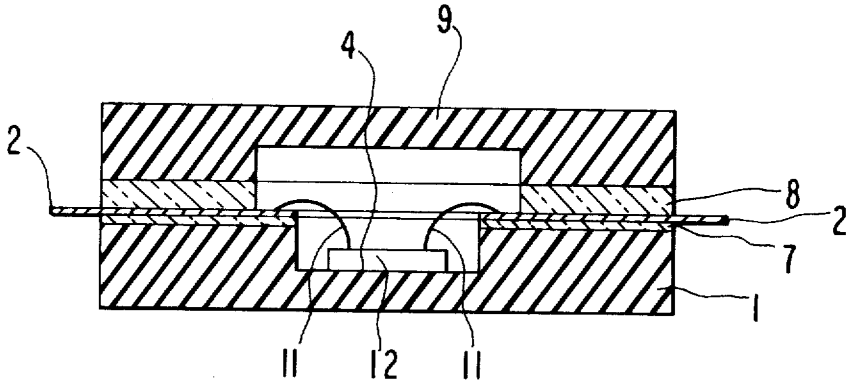
FIG. 6 is a cross-sectional view of the substrate and cap after they have been sealed with a semiconductor device electrically connected in the package.

The package of the invention is designed to be sold in the form shown in FIG. 2, along with a cap 9 shown in FIG. 5. The purchaser merely attaches his semiconductor device 12, as shown in FIG. 6 in central portion 4, connects it electrically (such as by tiny wires 11) to the inner portions 5 of leads 2, and seals cap 9 to the enclosure, all as illustrated in FIG. 6. As discussed above, this sealing can be carried out at low temperatures, for example below 500° C. Lower sealing temperatures also result in better final device yields.

What is claimed is:

1. Enclosure for encapsulating an electronic component comprising:

a substrate;

a conductive lead frame attached to said substrate and embedded in a composite glass layer on said substrate, said layer having a first lower portion which is substantially devitrified and a second upper portion which is substantially non-devitrified, said lead frame having surfaces exposed for electrical contact both within and without the perimeter of said substrate, the intermediate part of said lead frame between said exposed portions being embedded in said composite glass layer.

2. The enclosure of claim 1 further characterized by the addition of a semiconductor device attached to said substrate and electrically connected to said lead frame, and a cap covering said semiconductor device and sealed to said glass layer on said substrate.

3. The enclosure of claim 2 further characterized by said cap having a coating of glass which forms part of the seal together with said upper portion of said composite glass layer.

4. The enclosure of claim 1 further characterized by said upper portion of said composite glass layer covering said intermediate portion of said lead frame.

* * * * *